United States Patent [19]
Hoft et al.

[11] 3,947,700
[45] Mar. 30, 1976

[54] PHASE STABLE VARIABLE PHASE SLOPE LIMITER

[75] Inventors: Donald J. Hoft, Holliston; Raoul E. Plutchak, Acton, both of Mass.

[73] Assignee: The United States of America as represented by the Secretary of the Air Force, Washington, D.C.

[22] Filed: Aug. 29, 1974

[21] Appl. No.: 501,729

[52] U.S. Cl. ............................. 307/237; 330/30 D
[51] Int. Cl.² ...................................... H03K 5/08
[58] Field of Search ................... 330/30 D; 307/237

[56] References Cited
UNITED STATES PATENTS

| | | | |
|---|---|---|---|
| 3,422,286 | 1/1969 | Castelli | 307/237 |
| 3,435,359 | 3/1969 | Sennhenn | 330/30 D |
| 3,693,108 | 9/1972 | Iijima et al. | 330/30 D |
| 3,721,914 | 3/1973 | Nakamura | 330/30 D |

*Primary Examiner*—John S. Heyman
*Attorney, Agent, or Firm*—Joseph E. Rusz; Julian L. Siegel

[57] ABSTRACT

A phase stable limiter in the form of an emitter coupled amplifier. First and second parallel connected transistors have their emitters resistively coupled with the input terminal at the base of the first transistor and an output terminal at the collector of the second transistor. Another resistor is connected to the resistively connected emitters and to this resistor is connected a grounded variable capacitor. An inductor is connected between the base and the collector of the second transistor.

2 Claims, 2 Drawing Figures

PHASE STABLE VARIABLE PHASE SLOPE LIMITER

BACKGROUND OF THE INVENTION

This invention relates to phase comparison monopulse radar, and more particularly to a phase stable, adjustable phase slope limiter.

In certain types of monopulse tracking systems, such as the AN/TPN-19 Pulse Acquisition Radar, angle error information is contained in the phase of the signal processed in the two or three channels of the monopulse receiver. To provide gain normalization over the dynamic range, the signal is typically processed through limiting IF amplifiers. To assure that these limiting amplifiers do not add angle errors of their own to the processed signal, the phase shift through the limiter should remain constant over the entire dynamic range which is 65 db for the AN/TPN-19. An alternative is to allow the phase to vary in a prescribed manner with signal level and then match the sum and difference channels, or preferably normalizing to a constant phase where testing and aligning is simplified. The best phase versus level performance is obtained when the limiter bandwidth is very wise, i.e., when as many harmonics of the input signal as possible are passed, thus minimizing reflections and recombination, in uncontrolled phase, of these high frequency components. In the AN/TPN-19 radar, for example, the limiter presented here at 74 MHz provides excellent performance with typically less than 1° peak variation over the 65 db limiting dynamic range.

SUMMARY OF THE INVENTION

Improved phase stability versus level performance is obtained by inclusion of a tuned circuit in the active limiter circuit, which increases the effective stage bandwidth, thus permitting the transmission of a greater number of harmonics. Improved performance may be obtained for any transistor used as a limiter with a given gain-bandwidth product, $f_T$. Alternatively, for a given phase stability requirement, a lower $f_T$ unit may be utilized, at a corresponding cost savings.

The tuning provided is made moderately low-Q to assure relatively broadband spectrum enhancement. Further, a variable reactance is utilized, permitting shaping the high frequency response, i.e., adjusting the high frequency roll-off characteristic. This has the important advantage and unique capability of permitting shaping the phase versus signal level characteristic of the limiter. This is an important advantage of the invention since it allows, within limits, a means of adjusting to some prescribed phase versus level shape, e.g., adjusting for a constant phase versus amplitude.

It is therefore an object of this invention to provide a phase stable adjustable phase slope limiter for use in a phase comparison monopulse radar that has a broad bandwidth.

It is another object to provide a limiter that permits adjustment for constant phase versus amplitude characteristics.

It is still another object of the invention to provide a phase stable limiter in the form of an emitter coupled amplifier that has good isolation between the output and the input, thereby offering low feedback.

It is yet another object to provide an emitter coupled phase slope limiter that has current limiting.

These and other objects, features and advantages of the invention will become more apparent from the following description taken in connection with the illustrative embodiment in the accompanying drawings.

DETAILED DESCRIPTION OF THE PREFERRED EMBODIMENT

Figure 1:
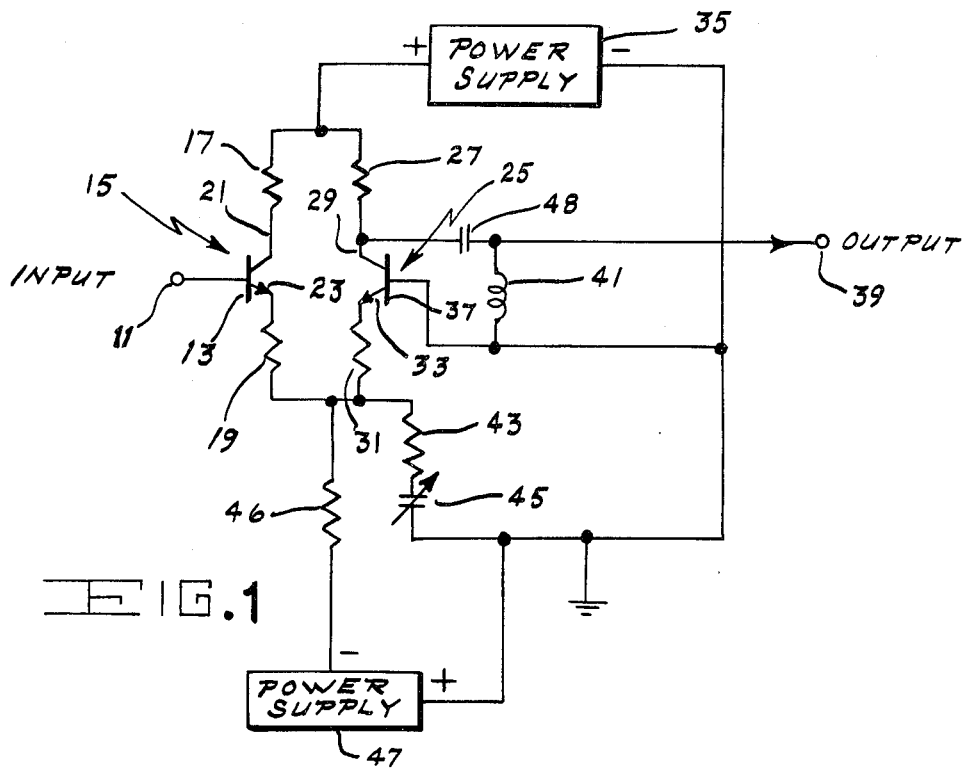
FIG. 1 is a circuit diagram showing an embodiment of the phase stable, adjustable phase slope limiter.

Referring to FIG. 1, there is shown a circuit diagram of the phase stable, adjustable phase slope limiter in the form of an emitter coupled amplifier. The input is inserted at terminal 11 which is connected to base 13 of NPN transistor 15. Biasing resistors 17 and 19 are connected to collector 21 and emitter 23, respectively, of transistor 15. Parallel to transistor 15 and resistors 17 and 19 is NPN transistor 25 having load resistor 27 connected to collector 29 and having biasing resistor 31 connected to emitter 33. B+ power supply 35 is connected to resistors 17 and 27 with the grounded side of this power supply being connected to base 37 of transistor 25. The output is obtained from terminal 39, connected to collector 29 through capacitor 48 and across inductor 41. Emitters 23 and 33 are connected to power supply 47 through parallel resistors 19 and 31 and resistor 46. To the mutual junction of resistors 19, 31, and 46 is connected the series combination of resistors 43 and variable capacitor 45 which is connected to ground.

Capacitor 45 is added to tune out internal inductance from the transistors and external inductance from the conductors thus significantly improving the high frequency performance of the circuit; the resistor 43 broadens the tuning effect, thus assuring enhancement to many high frequency components. Capacitor 45 is made adjustable to permit shaping the high frequency response, i.e., emphasizing or deemphasizing certain portions of the overall bandpass. In this way the individual stages can be adjusted for a flat or other desired shape for the phase response over its dynamic range. A large number of limiter stages may therefore be cascaded with the phase change over the entire dynamic range held nominally to the phase response of each individual stage, thus assuring tracking of multiple channels in a monopulse receiver.

Figure 2:
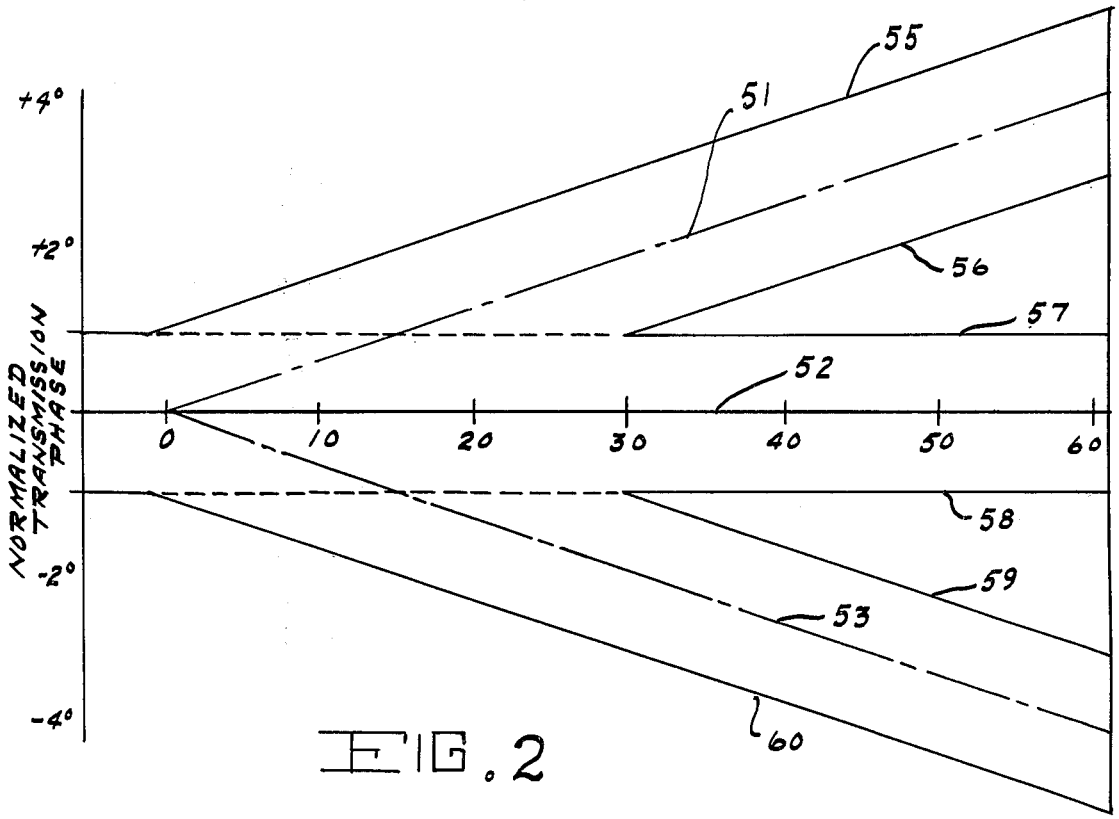
FIG. 2 is a graph showing typical phase relationships plotted against limit levels for the phase stable limiter.

FIG. 2 is a graph of three typical situations wherein the phase is plotted against the limit level and shows the stability of the variable phase slope limiter in the dynamic range. The abscissa is the input level in decibels and the ordinate represents the change in phase angle of the RF signal. The limits of the phase adjustment versus input level are shown as the upper and lower curve, the curve following the abscissa is the channels ideal, final adjustment. In each case center lines 51–53 signifies the normal slope and the outer lines 55–60 signify the maximum variations in both directions from the nominal. The typical variation about the nominal slopes are no greater than peaks of 1°.

What is claimed is:

1. A phase stable limiter comprising:
   a. a first transistor having a base, emitter, and collector with an input terminal at the base;
   b. a second transistor having a base, emitter, and collector with an output terminal at the collector;

c. first and second resistors connected to the emitters of the first and second transistors;
d. a third resistor connected to the first and second resistors;
e. a grounded capacitor connected to the third resistor;
f. a first power supply resistively connected to the collectors of the first and second transistors;
g. a second power supply resistively connected to the emitters of the first and second transistors; and
h. an inductor connected through a second capacitor between the collector and the base of the second transistor.

2. A phase stable limiter according to claim 1 wherein the capacitor is variable for slope adjustment.

* * * * *